(12) United States Patent
Huang et al.

(10) Patent No.: US 8,124,437 B2
(45) Date of Patent: Feb. 28, 2012

(54) FORMING PROTRUSIONS IN SOLAR CELLS

(75) Inventors: Chu-Wan Huang, Taipei County (TW); Ching-Yee Chak, Hong Kong (HK)

(73) Assignee: Du Pont Apollo Limited, Hong Kong (HK)

( * ) Notice: Subject to any disclaimer, the term of this patent is extended or adjusted under 35 U.S.C. 154(b) by 36 days.

(21) Appl. No.: 12/970,932

(22) Filed: Dec. 16, 2010

(65) Prior Publication Data

US 2011/0151611 A1   Jun. 23, 2011

Related U.S. Application Data

(60) Provisional application No. 61/288,845, filed on Dec. 21, 2009.

(51) Int. Cl.
*H01L 21/00* (2006.01)
*H01L 21/322* (2006.01)

(52) U.S. Cl. ........ 438/58; 438/472; 438/98; 257/E31.13

(58) Field of Classification Search ............ 438/58, 438/472; 257/E31.032, E31.13; 136/256
See application file for complete search history.

(56) References Cited

U.S. PATENT DOCUMENTS

| | | | | |
|---|---|---|---|---|
| 5,238,879 A | * | 8/1993 | Plaettner | 438/488 |
| 5,378,289 A | * | 1/1995 | Noguchi et al. | 136/258 |
| 5,704,992 A | * | 1/1998 | Willeke et al. | 136/255 |
| 6,716,659 B2 | * | 4/2004 | Wipiejewski | 438/44 |
| 2004/0061946 A1 | * | 4/2004 | Yoshikawa et al. | 359/626 |
| 2005/0250197 A1 | * | 11/2005 | Ando et al. | 435/285.1 |
| 2008/0308146 A1 | * | 12/2008 | Krasnov et al. | 136/256 |
| 2009/0194155 A1 | * | 8/2009 | den Boer et al. | 136/256 |

* cited by examiner

*Primary Examiner* — Kevin Parendo
(74) *Attorney, Agent, or Firm* — CKC & Partners Co., Ltd.

(57) ABSTRACT

Disclosed herein is a method for manufacturing a solar cell. The method includes the following steps. A substrate is provided. An article having a plurality of protrusions touches the surface of the substrate and thereby forming a plurality of indentations thereon. Subsequently, a transparent conductive layer is formed on the indented surface of the substrate, a photovoltaic layer is formed on the transparent conductive layer, and then a back electrode is form above the photovoltaic layer.

13 Claims, 7 Drawing Sheets

FORMING PROTRUSIONS IN SOLAR CELLS

RELATED APPLICATIONS

This application claims priority to U.S. Provisional Application Ser. No. 61/288,845, filed Dec. 21, 2009, which is herein incorporated by reference.

BACKGROUND

1. Field of Invention

The present invention relates to a method for manufacturing solar cells. More particularly, the present invention relates to a method for forming solar cells having textured structures.

2. Description of Related Art

Solar energy has gained many research attentions for being a seemingly inexhaustible energy source. Solar cells are devices developed for such purpose by converting solar energy directly into electrical energy.

Currently, solar cells are often made of single crystalline silicon, poly crystalline silicon, or amorphous silicon. In 2005, a solar cell with a high efficiency of 24.7% is developed, which is Passivated Emitter with Rear Locally Diffused (PERLD) Solar Cell. In PERLD solar cell, a pyramid-like structure is formed on the surface of the transparent conductive layer for trapping an incident light in the solar cell. Also, a high quality silicon wafer is employed in the solar cell. However, production of these types of solar cells would require not only high quality silicon wafers but also complicated processes, thereby rendering the manufacturing process cost in-effective.

For improving the above mentioned problem, a textured glass substrate formed by a sandblasting process is reported. Unfortunately, all the textured glass substrates formed by sandblasting processes substantially have different textured structures. That is, the textured structure formed on one glass substrate differs from another glass substrate. Thus, quality control, particularly, the reproducibility of the textured glass, during mass production may not be easily achieved.

Recently, a textured transparent conductive oxide (TCO) in solar cells is developed. One example is by depositing a textured layer of fluorine doped tin dioxide ($SnO_2$:F). The fluorine doped tin dioxide may form a desired crystalline surface, which has a columnar or pyramidal texture when deposited at a temperature of about 500 to 600° C. However, the requirement of high temperature makes the manufacturing process cost in-effective.

Therefore, there exists in this art a need of an improved method, which would resolve the above mentioned problem.

SUMMARY

The present disclosure provides a method for manufacturing a solar cell. The method comprises the following steps. A substrate having a surface is provided. An electrical conductive article having a plurality of protrusions is used to create a desired pattern on the surface of the substrate by applying a voltage to the article. A plurality of indentations are formed thereon. Afterwards, a transparent conductive layer is formed on the indented surface of the transparent substrate, a photovoltaic layer is formed on the transparent conductive layer, and then a back electrode is form above the photovoltaic layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The present disclosure provides a method for manufacturing a solar cell. The method comprises the steps of: providing a substrate having a surface; pressing an article having a plurality of protrusions against the surface of the transparent substrate and thereby forming a plurality of indentations thereon; forming a transparent conductive layer on the indented surface of the transparent substrate; forming a photovoltaic layer on the transparent conductive layer; and forming a back electrode above the photovoltaic layer.

Figure 1A:
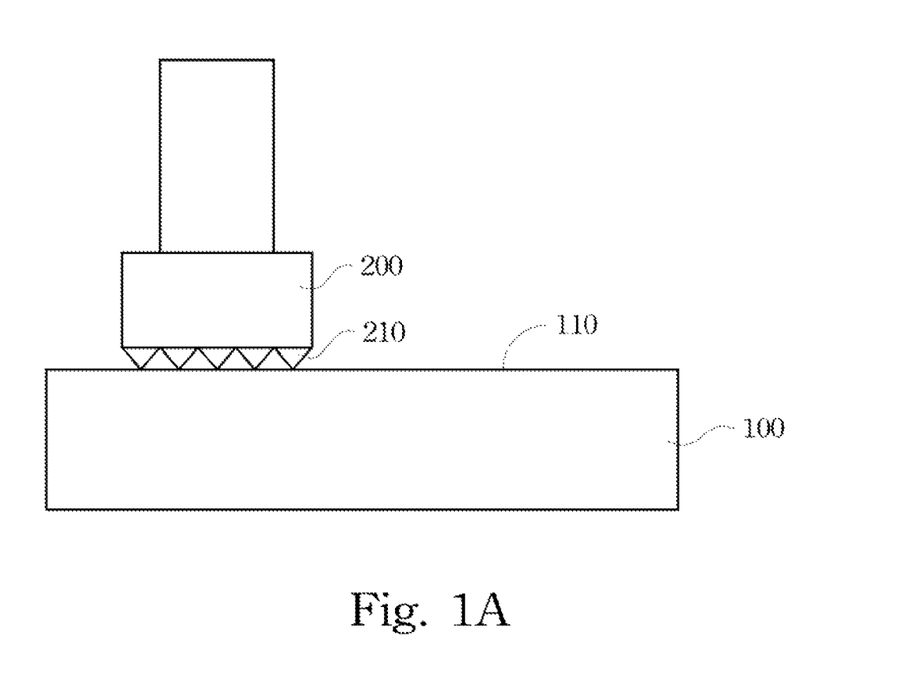
FIG. 1A to FIG. 1E are cross-sectional views illustrating process steps for manufacturing a solar cell according to one embodiment of the present disclosure.
Figure 2:
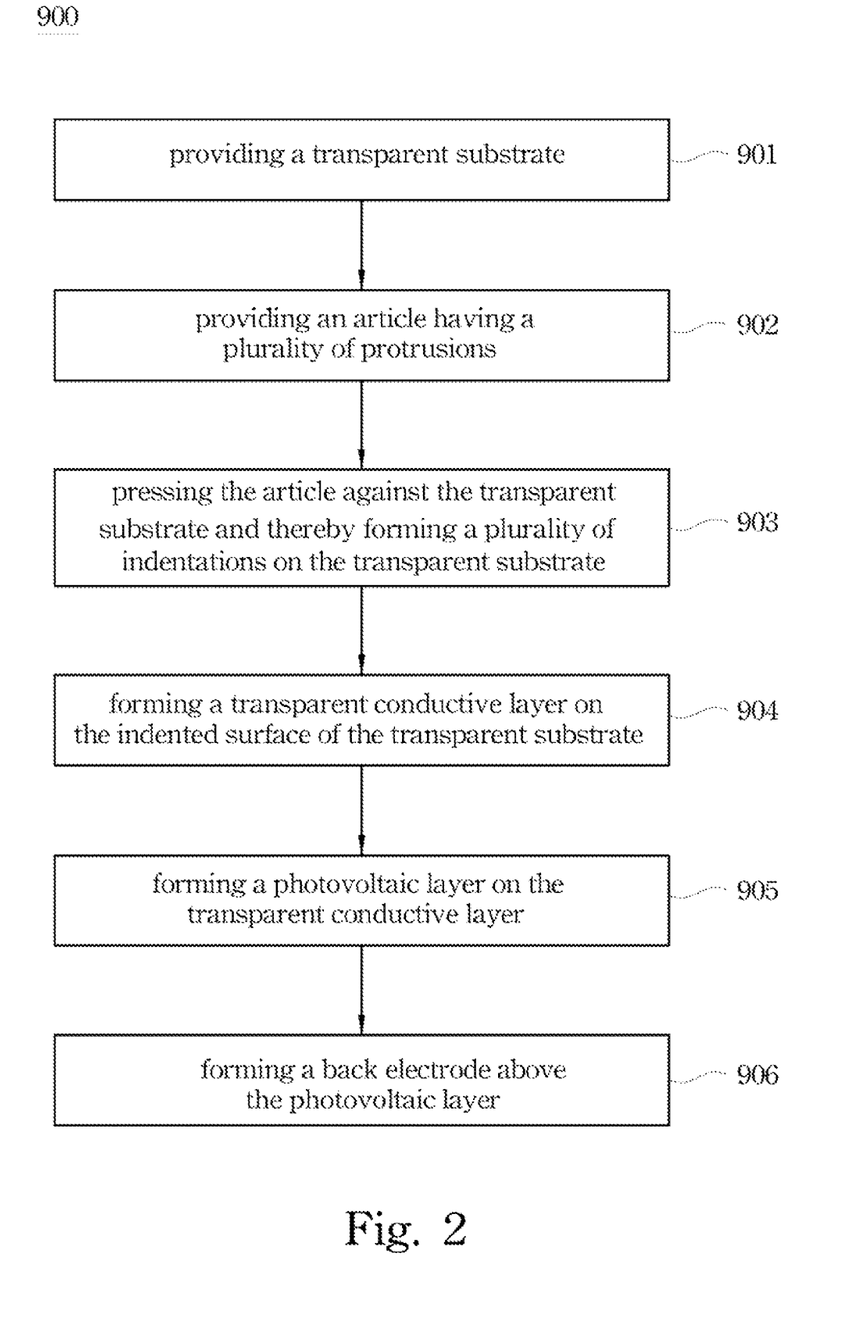
FIG. 2 is a flow chart of a method for fabricating solar cells according to one embodiment of the present disclosure.
Figure 3A:
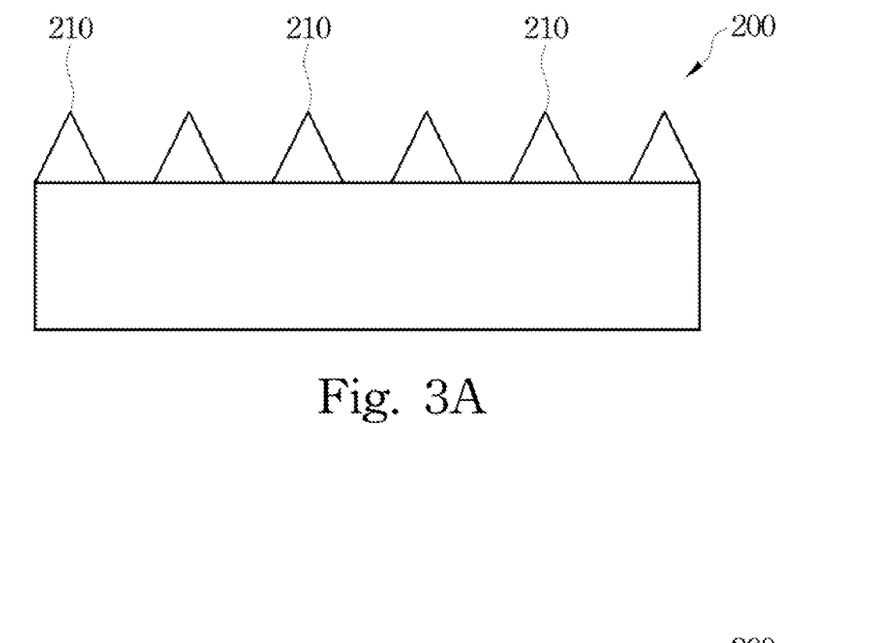
FIG. 3A and FIG. 3B are cross-sectional views illustrating an article according to one embodiment of the present disclosure.
Figure 3B:
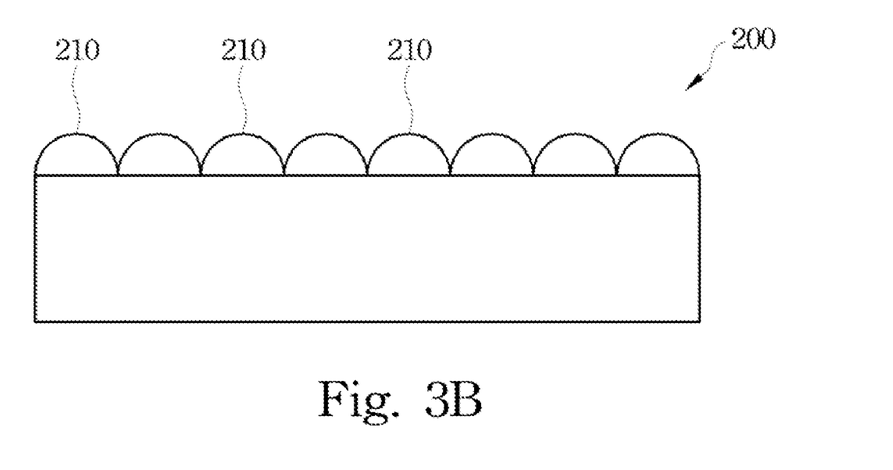
Figure 3C:
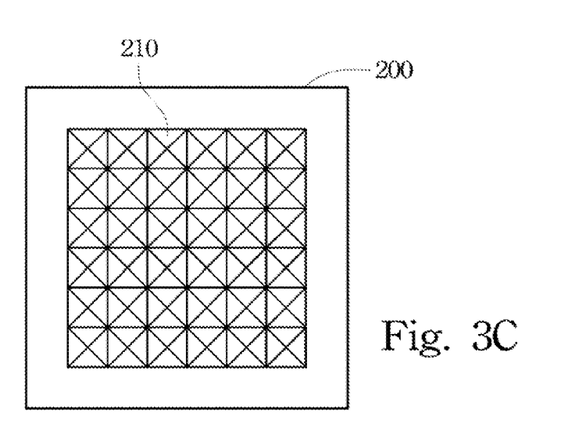
FIG. 3C to FIG. 3E are top views illustrating an article according to one embodiment of the present disclosure and FIG. 4 is a top view illustrating the movement of the article according to one embodiment of the present disclosure.
Figure 3D:
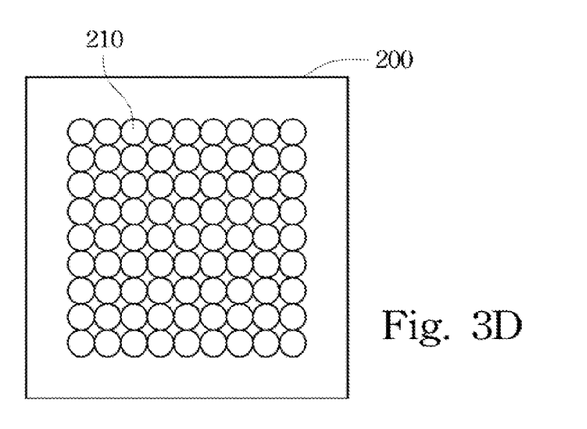
Figure 3E:
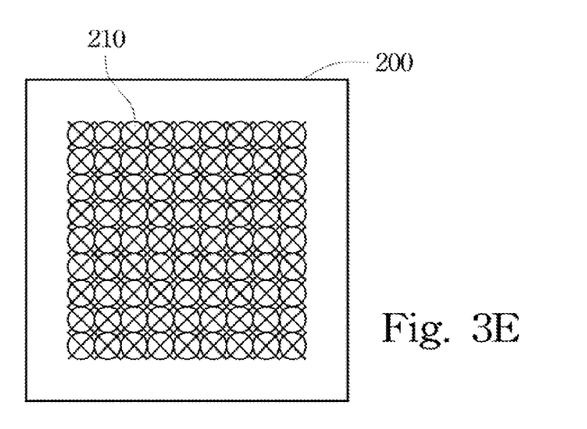

FIG. 1A to FIG. 1E are cross-sectional views illustrating process steps for manufacturing a solar cell according to one embodiment of the present disclosure. FIG. 2 is a flow chart of a method 900 for fabricating the solar cell of FIG. 1. In step 901, a substrate such as a transparent glass substrate is provided. The material of the transparent substrate is not limited, so long as it has a sufficient heat-resistant to endure the process conditions during the production of the solar cell, particularly in the deposition of the transparent conductive layer and the photovoltaic layer. Referring to FIG. 1A, the substrate 100 has a substantially flat surface 110 on which the process is performed. In one example, the substrate 100 is sucked by a pressure to fix the position In step 902, an article 200 having a plurality of protrusions 210 as depicted in FIG. 1A is provided. Step 902 may be performed either after or prior to step 901. In one embodiment, each of the protrusions 210 may have a height of about 3 μm to about 17 μm. In one example, each of the protrusion 210 has a height of about 10 μm. Further, the shape of the protrusion is not limited, which depends on the desired texture of the substrate. For example, each of the protrusions 210 may substantially have a pyramid shape, semi-spherical shape, or cone shape, as depicted in FIG. 3A and FIG. 3B. Also, FIG. 3C to FIG. 3E are top views illustrating the article 200 according to one embodiment of the present disclosure. Alternatively, the article 200 may have plurality of the protrusions 210 different mixed shapes according to the demands. In general, the protrusions 210 are made of a material having a hardness that is higher than that of the substrate 100. For example, While the substrate 100 is made of glass with a Mohs hardness value (also known as "Mohs scale of mineral hardness") of about 4.5 to about 6.5, the protrusions 210 may be made of quartz, topaz ((AlF$_2$)SiO$_4$), titanium nitride(TiN), alumina(Al$_2$O$_3$), silicon carbide (SiC), diamond or carbon-liked diamond.

In one embodiment, the protrusions 210 and the article 200 may be fabricated from the same materials and may be fabricated in one piece. In one example, both the protrusions 210 and the article 200 are made of quartz, and the protrusions 210 may be fabricated by photolithography. Dry etching processes such as reactive ion etching (RIE) may be employed, though wet etching processes that use saturated ammonium bifluoride solution as an etchant may be used as well. In another embodiment, the protrusions 210 and the article 200 may be fabricated from different materials. In one example, a plurality of SiC particles having a particle size of about 3 μm to about 17 μm is disposed on an article 200 that is made of stainless steel, and the SiC particles forms the protrusions 210 of the article 200.

Figure 1B:
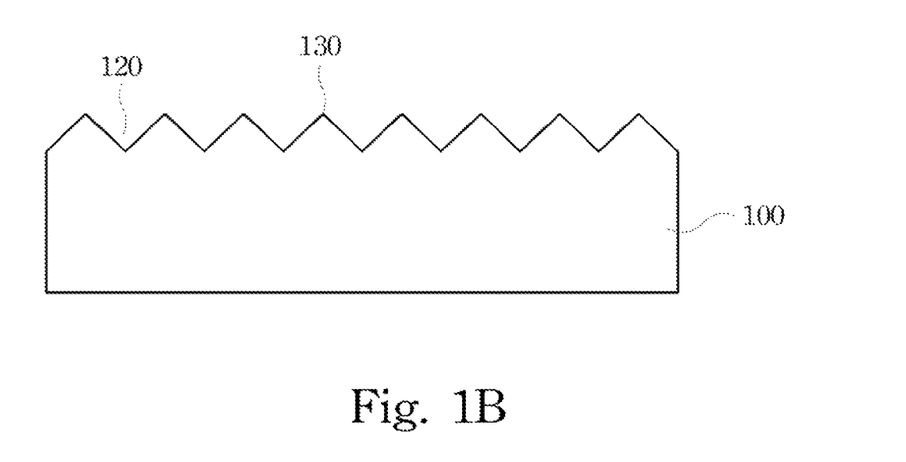

In step 903, the article 200 having the plurality of protrusions 210 is pressed against the surface 110 of the substrate 100, and thereby forms a plurality of indentations 120 on the surface 110 of the substrate 100, as depicted in FIG. 1B. In one example, the protrusions 210 applied onto the substrate 100 is controlled by the applied voltage of the article. In another example, the indented surface 130 of the substrate 100 formed by the protrusions 210 has an arithmetic mean roughness (Ra) of about 10 nm to about 40 nm, more specifically, about 25 nm to about 30 nm. And thus, a textured structure is formed on the surface of the substrate 100.

In one embodiment, a vertical distance between the article 200 and surface 110 of the substrate 100 is measured prior to or at the same time when the protrusions 210 touch the surface 110 of the substrate 100. In one example, a laser device (not shown) capable of emitting a laser beam is connected to the article, and the laser beam is projected to the surface 110 of the substrate 100. By analyzing the reflected laser from the substrate 100, the vertical distance between the surface 110 of the substrate and the article 200 may be determined according to the demands. The information of the distance may be used to control the displacement and/or movement of the article. Furthermore, a microscope (not shown) may also be employed to observe the indentations 120 formed by the protrusions 210.

Figure 4:
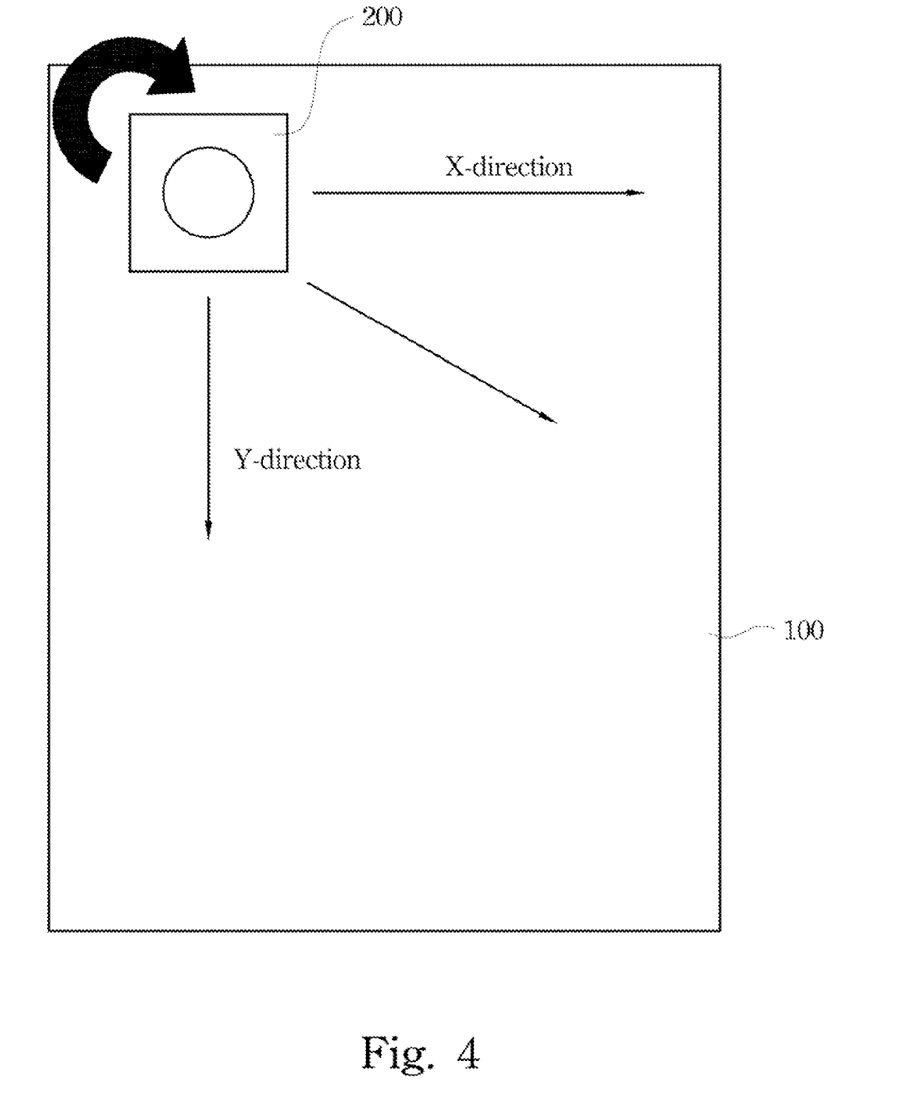

In another embodiment, when the protrusions 210 of the article 200 touch the substrate 100, the article 200 may simultaneously be moved to scribe the substrate 100, as depicted in FIG. 4. In one example, the article 200 may be moved along a direction parallel with the surface 110 of the substrate 100, such as X-direction or Y direction depicted in FIG. 4. Optionally, the article 200 may simultaneously be rotated to scribe the substrate 100 as well. Alternatively, the article 200 may touch or hit the substrate 100 for several times to form indentations 120. In other examples, the article 200 may be driven by an off-set bias voltage between 1 mV to 10 mV applied thereto, and thereby the vertical and horizontal displacement and the rotation of the article may be precisely controlled. By this approach, the textured structure formed on one substrate 100 may substantially be duplicated to another substrate while using the same article. Therefore, the reproducibility in mass production may be improved.

Figure 1C:
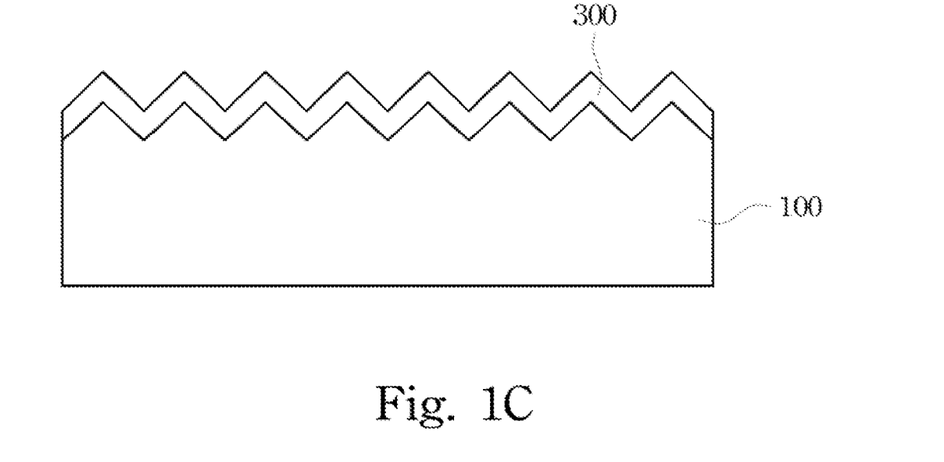

In step 904, a transparent conductive layer 300 is formed on the indented surface 130 of the substrate 100, as depicted in FIG. 1C. Suitable materials for the transparent conductive layer 300 include, but is not limited to, indium tin oxide; zinc oxide; zinc oxide doped with aluminium, fluorine, gallium or boron; cadmium sulphide; cadmium oxide; tin oxide; and fluorine doped tin dioxide (SnO$_2$:F). The transparent conductive layer 300 can be applied by any method known in the art, which includes, but is not limited to, metal organic chemical vapor deposition (MOCVD), sputtering, atmospheric pressure chemical vapor deposition (APCVD), plasma enhanced chemical vapor deposition (PECVD), and evaporation (physical vapor deposition).

The temperature of forming the transparent conductive layer 300 may possibly be decreased, for the step of forming a textured structure is no longer required. In the prior art, the transparent conductive layer 300 is deposited at a temperature of 500 to 600° C. to form a crystalline surface with a columnar light scattering texture, or after-treated at the above mentioned temperature. In the present disclosure, an indented surface 130 has been formed on the substrate 100 prior to forming the transparent conductive layer 300. Therefore, the transparent conductive layer 300 may be deposited conformally at a much lower temperature.

Figure 1D:
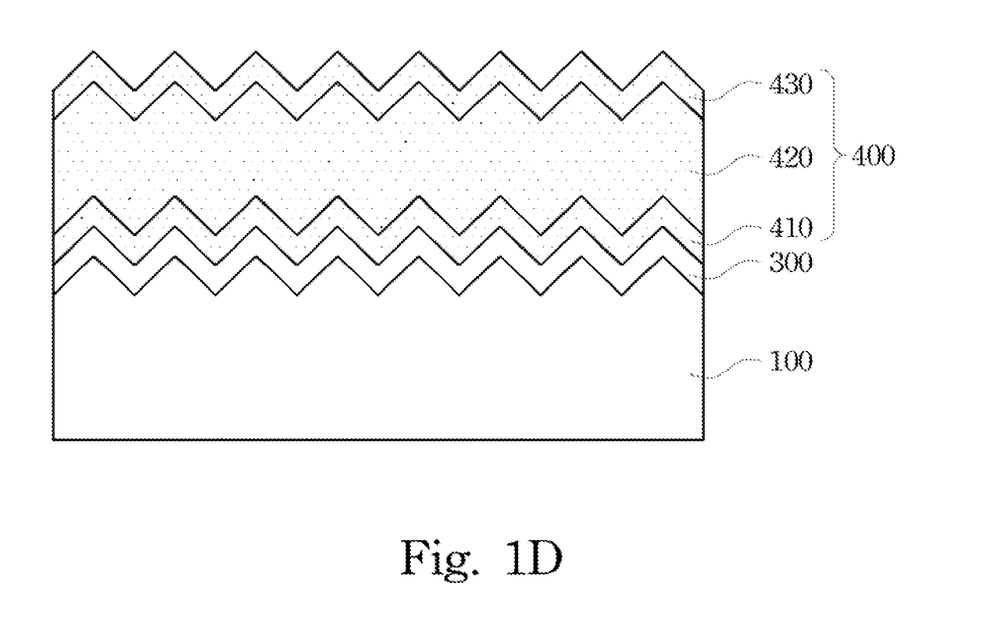

In step 905, after application of the transparent conductive layer 300, a photovoltaic layer 400 may be formed on the transparent conductive layer 300, as depicted in FIG. 1D. It should be noted that in the present disclosure the term "photovoltaic layer" comprises all layers that is needed to absorb the light and convert it into electricity. Various thin film semiconductor materials may be employed in the photovoltaic layer 400. Suitable materials includes, but is not limited to, amorphous silicon (a-Si:H), polycrystalline silicon, signal crystalline silicon, polycrystalline amorphous silicon carbide (a-SiC), and amorphous silicon-germanium (a-SiGe). In the amorphous silicon embodiment, the photovoltaic layer 400 may comprise a p-doped amorphous silicon layer 410, an intrinsic amorphous silicon layer 420, and a n-doped amorphous silicon layer 430 (also known as "p-i-n structure"), with the p-doped amorphous silicon layer 410 being situated on the transparent conductive layer 300. Further, a plurality of repetitive p-i-n layers ("pin-pin-pin" or "pin-pin-pin-pin") may sequentially be formed as well.

Processes similar to the formation of the transparent conductive layer 300 may be employed to form the photovoltaic layer 400. In one embodiment, the amorphous silicon is formed by the CVD method, wherein a RF power of 1 to 500 W/cm$^2$ may be used, and the temperature may be in the ranged of 100° C. to 300° C.

Figure 1E:
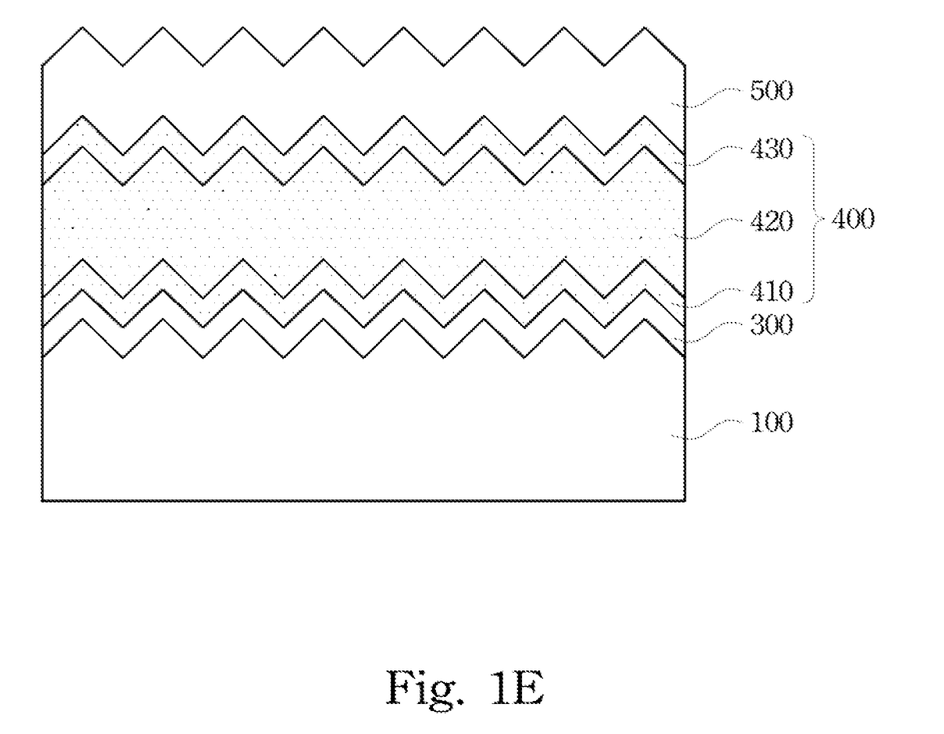

In step 906, a back electrode 500 is formed on or above the photovoltaic layer 400, as depicted in FIG. 1E. In one example, the back electrode 500 is made of silver, which has good conductivity and provides desirable ohmic contact with the subjacent semiconductor layer. In this example, an adhesion promoter layer (not shown) such as TiO$_2$, TiN, and ZnO may optionally be formed between the silver layer and the photovoltaic layer 400. In some examples, the back electrode 500 may serve as both a reflector and an electrode. Suitable materials for the back electrode 500 includes, but is not limited to, silver, aluminum, copper, chromium and nickel. However, in other examples, the back electrode 500 may be transparent, which may have same material as the transparent conductive layer 300.

The back electrode 500 may be formed by any known method such as sputtering or other physical vapor depositions. In one example, the back electrode 500 is deposited by sputtering at a temperature less than 250° C., for example 220° C.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a solar cell, comprising:
   providing a substrate having a surface;
   pressing an article having a plurality of protrusions against the surface of the substrate and thereby forming an indented surface having a plurality of indentations thereon, wherein the article includes a substantially flat surface on which each protrusion of the plurality of protrusions are disposed, and each protrusion of the plurality of protrusions is made from a material selected from the group consisting of quartz, topaz, titanium nitride(TiN), alumina($Al_2O_3$) and silicon carbide (SiC);
   forming a transparent conductive layer on the indented surface of the substrate;
   forming a photovoltaic layer on the transparent conductive layer; and
   forming a back electrode above the photovoltaic layer.

2. The method according to claim 1, further comprising a step of measuring a vertical distance between the article and the surface of the substrate prior to or at the time of the pressing the plurality of protrusions of the article against the surface of the substrate.

3. The method according to claim 1, further comprising a step of rotating the article during the pressing the plurality of protrusions of the article against the surface of the substrate by adjusting an off-set bias voltage.

4. The method according to claim 1, further comprising a step of moving the article along a direction parallel with the surface of the substrate during the pressing the plurality of protrusions of the article against the surface of the substrate.

5. The method according to claim 4, wherein the step of moving the article is controlled by applying an off-set bias voltage to the article.

6. The method according to claim 5, wherein the off-set bias voltage is between 1 to 10 mV.

7. The method according to claim 1, wherein each protrusion of the plurality of protrusions has a pyramid shape, a semi-spherical shape, or a cone shape.

8. The method according to claim 1, wherein the material has a hardness higher than a hardness of the substrate.

9. The method according to claim 1, wherein each protrusion of the plurality of protrusions has a height of about 3 µm to about 17 µm.

10. The method according to claim 1, wherein the indented surface of the substrate has an arithmetic mean roughness of about 10 nm to about 40 nm.

11. The method according to claim 1, wherein the transparent conductive layer comprises at least one material selected from the group consisting of indium tin oxide; zinc oxide; zinc oxide doped with aluminium; zinc oxide doped with fluorine; zinc oxide doped with gallium; zinc oxide doped with boron; cadmium sulphide; cadmium oxide; tin oxide; and fluorine doped tin dioxide.

12. The method according to claim 1, wherein the step of forming the photovoltaic layer comprises:
   forming a p-type semiconductor on the transparent conductive layer;
   forming an intrinsic semiconductor on the p-type semiconductor; and
   forming a n-type semiconductor on the intrinsic semiconductor.

13. The method according to claim 1, wherein the back electrode comprises at least one material selected from the group consisting of silver, aluminum, copper, chromium and nickel.

* * * * *